United States Patent [19]  [11] 4,163,944
Chambers et al.  [45] Aug. 7, 1979

[54] COMPENSATION CIRCUIT FOR AN ELECTRICAL SIGNAL MIXER

[75] Inventors: Ramon P. Chambers, Clearwater; Robert S. Gordy, Largo; David E. Sanders; Cameron E. Morrison, both of St. Petersburg, all of Fla.

[73] Assignee: NCR Corporation, Dayton, Ohio

[21] Appl. No.: 753,388

[22] Filed: Dec. 22, 1976

[51] Int. Cl.² ............................................. H04B 1/10
[52] U.S. Cl. ..................................... 325/446; 325/65; 332/18
[58] Field of Search ............... 325/446, 474, 473, 324, 325/30, 42, 65, 323, 320, 321, 38, 34, 139, 152, 22; 332/18, 43, 44, 46, 47

[56] References Cited

U.S. PATENT DOCUMENTS

| 2,702,209 | 4/1955 | Ambrosio | 325/474 |
| 3,478,268 | 11/1969 | Coviello | 325/474 |
| 3,924,186 | 12/1975 | Gordy et al. | 325/320 |

Primary Examiner—Robert L. Richardson
Assistant Examiner—Tommy P. Chin
Attorney, Agent, or Firm—J. T. Cavender; Edward Dugas

[57] ABSTRACT

The carrier suppression circuit of the present invention is utilized to minimize electrical imbalances within double-balanced mixers. The circuit operates upon a modulating signal, having at least two states so as to adjust the dwell time that the signal stays in a particular state to counteract the effects of electrical imbalance within the mixer. Minimization of the electrical imbalance provides a greater suppression of the carrier signal which, in turn, improves the quality of the signal both at the transmitter and at the receiver.

8 Claims, 6 Drawing Figures

COMPENSATION CIRCUIT FOR AN ELECTRICAL SIGNAL MIXER

BACKGROUND OF THE INVENTION

The present invention is related to the field of modulators and demodulators of the type that are used in high speed digital data communication systems and, more particularly, to communication systems of the spread spectrum type wherein a pseudo-random (PR) or pseudo-noise (PN) sequence signal modulates a carrier signal in conjunction with a modulating data signal to effect a spread of the spectrum of the carrier signal.

Spread spectrum communications systems utilize a transmission bandwidth many times as large as the information bandwidth in order to achieve jam resistance and to otherwise receive the data signal against decoding. An additional advantage includes multi-path signal rejection. To spread the spectrum of the carrier signal, a PN sequence of binary pulses that are linear larger or non-linear, is used to modulate the phase of a carrier signal either before, or after, modulation by the data signal. Modulation of the carrier signal by the PN signal spreads the bandwidth of the carrier signal to that of the PN signal, the PN signal having a much greater bandwidth than the data signal. A difficulty arises when a mixer circuit of the double-balanced type is used as the modulating means in the transmitter and/or as the demodulating means in the receiver. The task of attempting to match the electrical characteristics of all the like components forming the double-balanced mixer so as to provide a perfectly symmetrical output signal when a symmetrical input signal is received as the modulating signal is extremely difficult. In actuality, what occurs, is that for a symmetrical modulating signal, the output signal is not symmetrical both in amplitude and in phase. This imperfection and/or imbalance causes, for example, in the transmitter a carrier spectral line to be present in the transmitted signal. This spectral line will allow relatively easy detection of the data signal by an intruder. Conversely, in the receiver, the presence of a carrier spectral line having a power level that exceeds adjacent spectral lines, reduces the protection afforded by the circuit against a synchronous, continuous wave (CW) jammer or a CW jammer with a frequency offset less than half of the receiver's IF strip bandwidth. The effect then is that the carrier spectral line present in the received signal reduces the processing gain of correlators and/or demodulators used within the receiver.

As a further discussion of the operation of a spread spectrum type receiver, the received spread spectrum signal is correlated with a replica of the PN sequence that was used to modulate the carrier signal to collapse the signal back to its original data bandwidth. Once the signal is back to the data bandwidth it is detected, generally, by a phase lock loop.

For a general discussion of spread spectrum techniques which are utilized against interferring waveforms and/or detection, reference is made to "A Discussion of Spread Spectrum Composite Codes" by D. J. Braverman, dated Dec. 1, 1963, and available from the Defense Documentation Center as AD No. 425862. Two patents of interest for showing the state of the art as regards spread spectrum communications systems are U.S. Pat. No. 3,478,268 entitled "Suppression of Strong Interferring Signals In A Radio Receiver", by G. J. Coviello; and U.S. Pat. No. 3,916,313 entitled "PSK-FSK Spread Spectrum Modulation/Demodulation", by R. B. Lowry. Both of the aforereferenced patents deal with a PN sequence being used to broaden the spectrum of a carrier wave.

The present invention eliminates the difficulty associated with attempting to compensate for the imbalance in the electrical characteristics of the mixer.

SUMMARY OF THE INVENTION

In one preferred embodiment of the invention, there is provided; a means for generating a two-state signal, and a mixer having two inputs and an output. One mixer input is adapted to receive a carrier signal and the other mixer input is adapted to receive a two-state modulating signal. The mixer operates to provide at its output a signal that is a function of the signals received at its inputs. A delay control means is interposed between the output of the generating means and the other input to the mixer for selectively adjusting the dwell time of the two-state signal so as to compensate for imbalances in the mixer.

From the foregoing, it can, therefore, be seen that it is a primary object of the present invention to provide a compensating circuit for an electrical signal mixer.

It is another object of the present invention to provide a compensating circuit for balancing the output signals from an electrical signal mixer.

These and other objects of the present invention will become more apparent when taken in conjunction with the following description and drawings wherein like characters indicate like parts and which drawings from a part of the present disclosure.

DESCRIPTION OF THE PREFERRED EMBODIMENTS OF THE INVENTION

Figure 1:
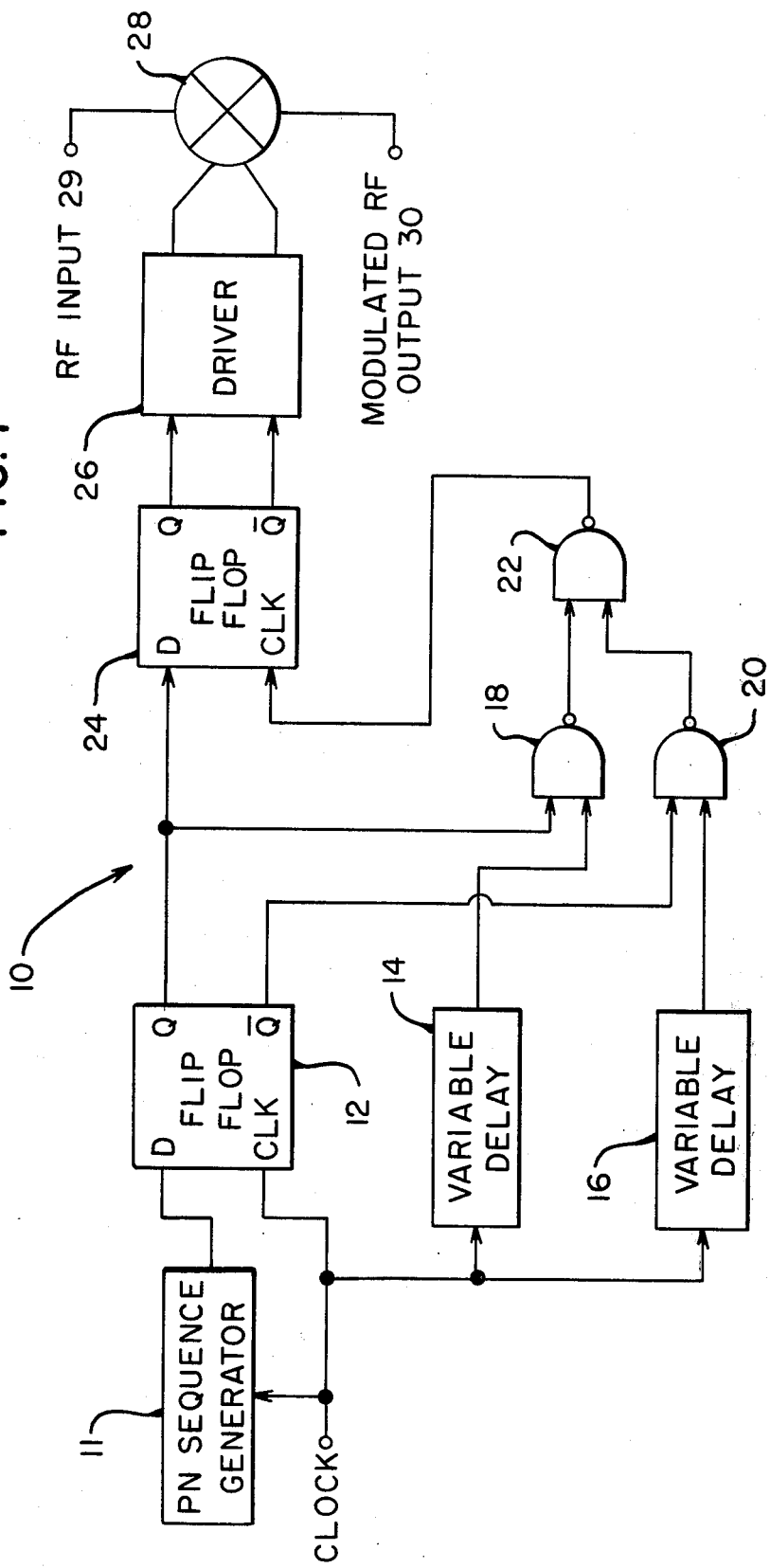
FIG. 1 is a logic block diagram of the preferred embodiment of the invention.

Referring to FIG. 1, the compensating circuit 10 finds particular utility in communication devices wherein the transmitted message is to be secured against jamming and detecting efforts. Within such a system an RF carrier signal can be modulated by a pseudo-random sequence signal (PR) or, equivalently, a pseudo-noise (PN) sequence. The modulation generally is in the form of a phase shift keying (PSK) of the carrier. The modulated RF signal is then again modulated with the data signal to provide a spread spectrum signal, which signal is more difficult to jam and/or detect. The circuit 10 is implemented using a PN sequence generator 11, which generator, in response to a clock signal, provides a pseudo-random (noise) binary bit sequence of pulses PN to the D input of a D-type flip-flop 12. The PN sequence generator 11 may be, for example, a multi-stage shift register having feedback connections from selected ones of the multi-stages. The clock signal to generator 11 controls the shifting of the pulses through the stages of the shift register. The PN sequence of pulses is generally taken from the last stage of the shift register. In the preferred embodiment of the invention, the PN sequence generator was of the maximum length linear shift register type. For the present embodiment, a D-type flip-flop is defined as one wherein for a positive going transition of a clock pulse received on the CLK input the data present at the D input is transferred to the Q output with the complement appearing at the $\bar{Q}$ output. The signals present at the outputs Q and $\bar{Q}$ will remain there until the next positive going clock pulse is applied to the CLK terminal. At that time, if the data at the D input differs from the data previously present at the D input, during the previous clock time, the output signals at Q and $\bar{Q}$ will change states to reflect the new data state. If the data is the same, the output signals at the Q and $\bar{Q}$ terminals will remain the same. A first and a second variable delay circuit 14 and 16 receives as an input the clock signal. The output from the variable delay circuit 14 and from the variable delay circuit 16 are fed as one of the inputs to NAND gates 18 and 20, respectively. The NAND gates 18 and 20 also receive the Q and $\bar{Q}$ outputs from flip-flop 12, respectively. The outputs from NAND gates 18 and 20 are directed as inputs to NAND gate 22. A D-type flip-flop 24 receives the signal from the Q output of flip-flop 12 at its D input, and the output from the NAND gate 22 at its CLK input. The signals present at the outputs Q and $\bar{Q}$ of flip-flop 24 are used to drive a driver 26. Driver 26 converts the logic level signals to power levels commensurate with the requirements of a mixer circuit. A mixer circuit 28 receives at its input terminal 29 the RF carrier signal that is to be phase modulated. At the modulating inputs of the mixer, the signals present at the output of the driver 26 are applied in order to effect the phase modulation of the carrier signal. The output of mixer 28 is the phase modulated RF signal. The mixer 28 in the preferred embodiments of the invention were double-balanced mixers.

Figure 2:
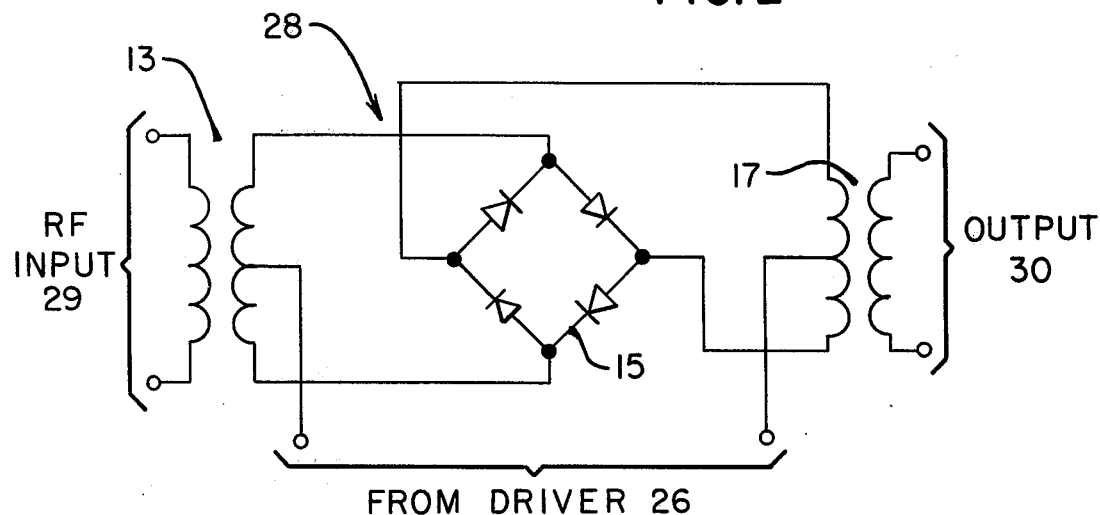
FIG. 2 is a schematic diagram of a mixer which may be used in conjunction with the FIG. 1 embodiment.

Referring now to FIG. 2 wherein is shown a schematic diagram for a double-balanced mixer of the type used for mixer 28. Mixer 28 is comprised of a transformer 13 having a center-tapped secondary winding. The primary winding of transformer 13 is an input to the double-balanced mixer, to which input the carrier signal is applied. A second matched transformer 17 is connected such that its secondary winding is connected to provide the output 30 with the center-tapped primary winding being connected so as to receive the rectified signal from the fullwave rectifying bridge 15. The AC side of bridge 15 is connected across the secondary winding of transformer 13. The modulating signal from driver 26 is connected across the center taps of transformers 13 and 17.

In operation of the balanced mixer 28, the carrier signal is coupled by the transformer 13 to the rectifier 15. A positive signal on the center tap of transformer 17, with respect to the center tap of the secondary of transformer 13, causes the lower right and the upper left diode, in the full-wave bridge 15, to conduct. Once the diodes are in conduction the carrier signal can pass to the output 30. When the polarity of the signal from the driver is reversed, the opposite two diodes conduct and the carrier signal is passed through the primary of transformer 17 in the opposite direction. In the preferred embodiment of the invention the RF input (carrier signal) does not have enough strength to drive the diodes into conduction; therefore, the driver signal controls the rectification of the carrier signal. A demodulator utilizing the mixer of FIG. 2 would have the modulated carrier signal applied to the RF input 29. The drive signal would remain the same, with the output from the mixer being the demodulated signal.

Figure 3:
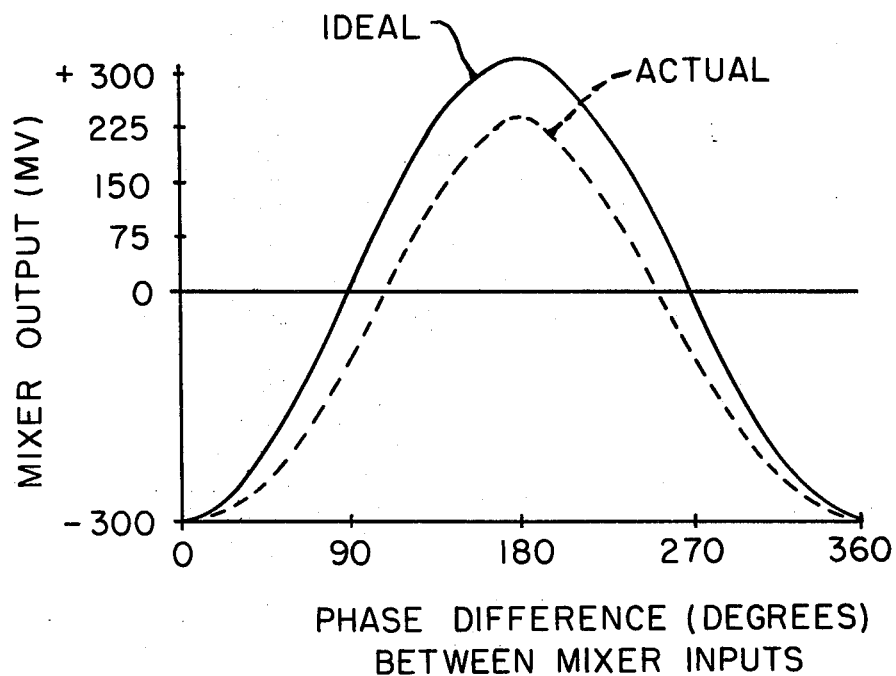
FIG. 3 is a chart illustrating the output from the mixer of FIG. 2 as a function of the phase difference between the signals at its input.

In the ideal case, all of the components that are used to construct the double-balanced mixer are identical in construction and electrical characteristics, that is, each of the components are matched such that, for example, the center-tap of each of the transformers equally divides the associated winding into two equal windings such that the electrical characteristics on either side of the center-tapped are equivalent. The same should be true for the diodes, namely that the forward impedance of each of the diodes is equal and the reverse impedance of each of the diodes is also equal. As a practical matter, this is not possible. Therefore, referring to FIG. 3, we note that the actual output from the mixer, in terms of millivolts, differs in amplitude from the zero reference line in the positive and negative directions. This difference in amplitude causes the carrier signal to be ineffectively cancelled within the demodulator circuit. The waveform of FIG. 3 depicts the output function as relates to the phase difference between the input signals at the input 29 and the signal from driver 26. When the phase relationship, that is the difference between the two input signals is zero, the output of the mixer is a maximum of −300 millivolts. The value of 300 millivolts is, of course, a nominal value and depends upon the amplitude of the two input signals. Likewise, if the phase difference between the two input signals is 360°, the output of the mixer is again −300 millivolts. If the phase difference is 90° and/or 270°, the output of the mixer is 0 millivolts. Again, this is for the ideal case. As to be noted in the actual case, as shown by the dotted lines, there is a degree of imbalance which means that the output is 0 volts for a slightly differing phase relationship, that is for some other value than 90° and/or 270°. Again, at a 180° phase difference the output, ideally, from the mixer is +300 millivolts. In actuality, the value would be somewhat less and/or more depending upon the direction of the imbalance but, for the particular case illustrated, the imbalance brings the output down to approximately +225 millivolts. It is this imbalance effect that the present invention directs itself to and attempts to correct.

Figure 4:
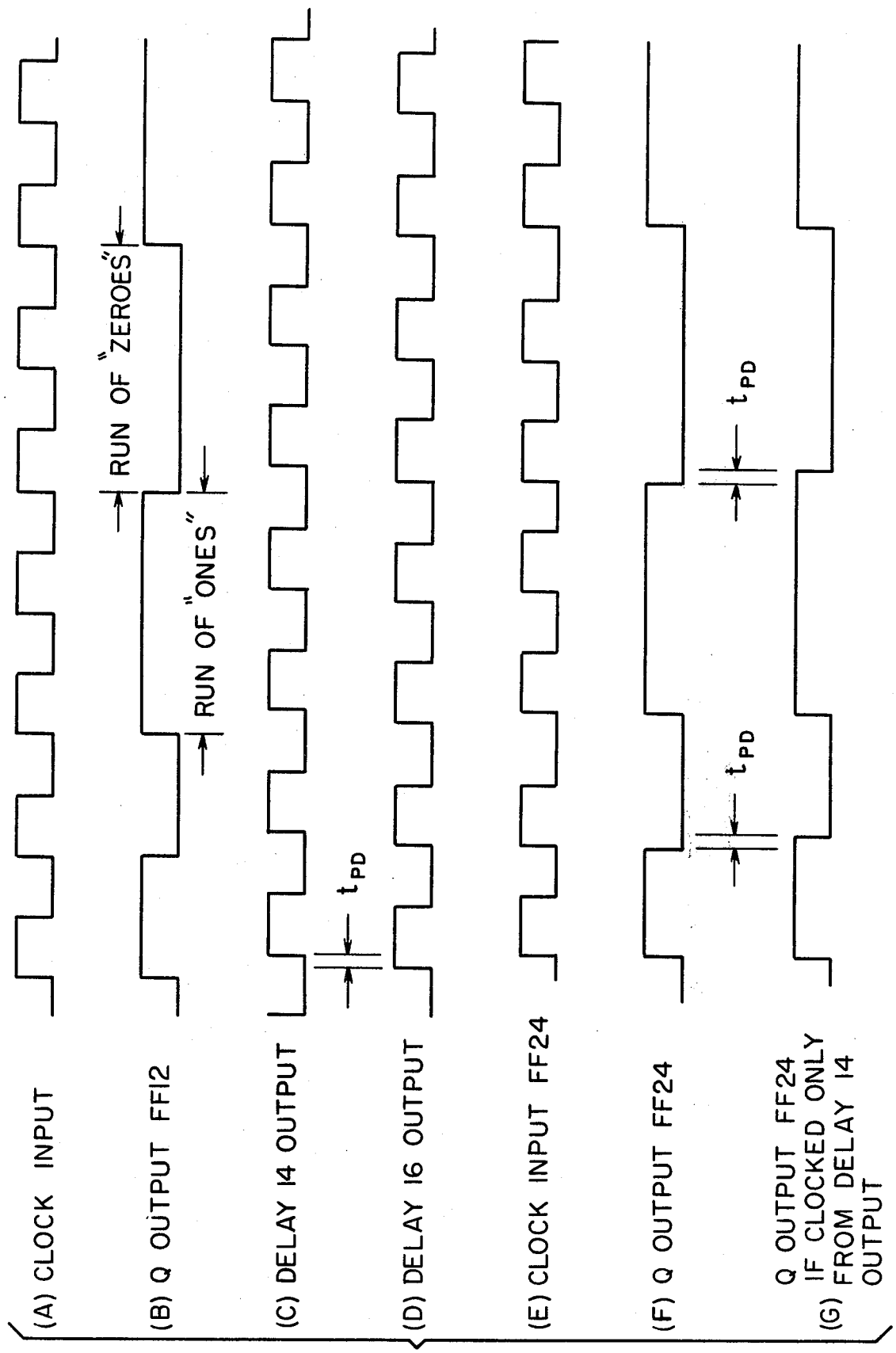
FIGS. 4A to 4G illustrate logic waveforms taken from strategic points within the preferred embodiment of FIG. 1.

Referring now to FIG. 4, in conjunction with the embodiment of FIG. 1. In FIG. 4A the clock input signal applied to the PN sequence generator 11, flip-flop 12 and the variable delay circuits 14 and 16 is shown. The Q output of flip-flop 12 is shown in FIG. 4B. It is to be noted that the transition of the waveform of FIG. 4B occurs only at the occurrence of a low to a high transition for the clock signal. As is well known in the art, a PN sequence signal is comprised of sequences of ones and zeros. For purposes of the present invention, a low level signal is defined as a zero (0) and a high level signal is defined as a one (1). The sequences may be for two or more adjacent ones, which, by definition, constitutes a run of ones. In a similar manner, a sequence of two or more zeros constitutes a run of zeros. It is not necessarily the case that a run of ones and/or zeros immediately be followed by a run of the opposite type of equal length, even though this is what is shown in the waveform of FIG. 4B. The purpose therein is only to provide an example in order to facilitate an understanding of the operation of the present invention. The output signal present at the Q output of flip-flop 12 is, in fact, a replica of the signal present at the D input flip-flop 12, but synchronized in time to the positive going transitions of the clock input signal. The present circuit operates upon the signal from the Q output of flip-flop 12 in a manner which will increase the dwell time, that is the time in which the signal stays in a particular state, and/or decrease the dwell time so as to effectively cancel the imbalance effect caused by the electrical difference between the components of the mixer. The electrical effect that is controlled by adjusting the dwell time is that of power. That is, an increase in dwell time for a "one" will increase the power out from the mixer, a decrease in dwell time will decrease the power out. By proper adjustment of the dwell time, the total output power in the two mixers in the "ON" state can be balanced. In referring to the waveform of FIG. 4B, the dwell time of ones would be increased by delaying the clock, low to high transition, at the end of the run of ones or by decreasing the delay of the clock, low to high transition, at the start of the run of ones. The dwell time for a run of zeros would be increased in a similar manner. To determine which particular run is to be increased and/or decreased, the circuit is initially started up and the variable delays 14 and 16 are adjusted to provide the proper compensation so as to maximize the cancellation of the carrier signal from the mixer. The input signals to NAND gates 18 and 20, that are derived from the Q and $\bar{Q}$ outputs of flip-flop 12, are providing the gating signals for the two NAND gates and to control which gate operates NAND gate 22. These three NAND gates constitute a digital switch, which switch operates to select the clock delayed by either the delay associated with the variable delay 14 or by the delay associated with the variable delay 16. In turn, this selection is dependent upon whether the PN sequence entering the D input of flip-flop 12 is a 1 or a 0, that is, whether the signal is of a high and/or low level, respectively. A 1 level signal selects the clock delayed by delay 14. A 0 level signal selects the clock delayed by the variable delay 16. The difference between the two delays, for purposes of this disclosure, is designated $t_{pd}$. The two delay circuits are designed such that the inherent minimum delay within these circuits is greater than the maximum delay normally associated with the flip-flop circuit 12. This insures that the flip-flop will change state before the clock's leading edge (low to high transition of the clock) reaches the input of the NAND gates 18 and 20 respectively. The output from NAND gate 22 will thus control the rate and/or time at which the Q output from flip-flop 12, that is the PN sequence, is clocked through flip-flop 24. This control will effectively fix the dwell time for each run of ones and zeros. In FIG. 4D the output of the variable delay 16 is shown making a low to high transition, a delayed time after the low to high transition for the clock input. As previously stated, this delay is of a sufficient magnitude so as to allow flip-flop 12 to reach its settled output state before this output from delay 16 is received by the NAND gate 20. In FIG. 4C, the output from the variable delay circuit 14 is shown with a transition from a low to a high state occurring a time period equal to $t_{pd}$ after the transition of the output signal from the delay circuit 16. This delay is the delay that is preset by initially adjusting the delay of delays 14 and 16 to the desired minimum imbalance position. NAND gate 22 generates a re-clocking signal from the output of gates 18 and 20 which is delayed in time and modified in pulse width from the clock input signal as shown in FIG. 4E. The reclocking signal output of NAND gate 22 provides the clock input to flip-flop 24. Flip-flop 24 then operates to pass the data present on its D input to the Q output upon the occurrence of a low to high transition of the signal present at its CLK input. The output of flip-flop 24, taken from the Q terminal, is shown in FIG. 4F. In order to more clearly show the effect that the dual delay has upon the signal appearing at the output of flip-flop 24, FIG. 4G, depicts the output of flip-flop 24, for the condition where the variable delay 16 is disabled. In this particular instance then, the clock delay from the variable delay 14 will be clocking the PN signal through flip-flop 24.

Figure 5:
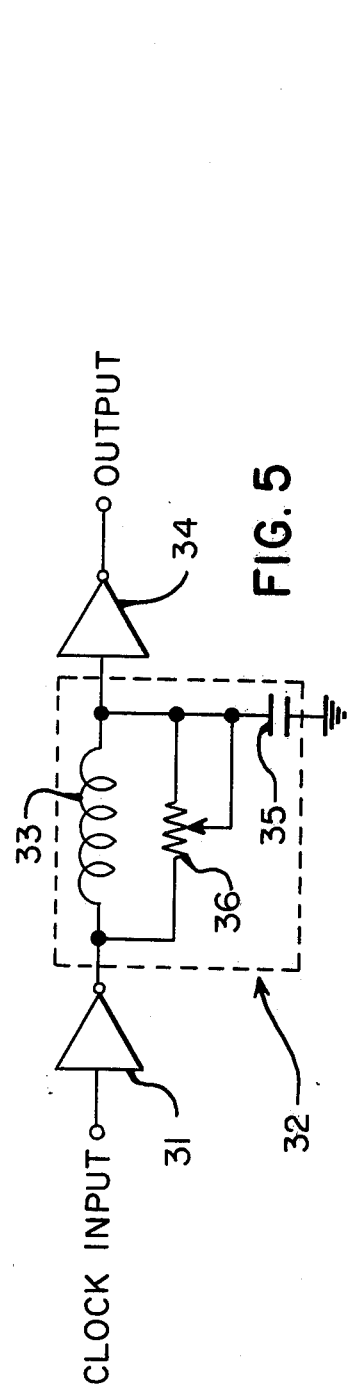
FIG. 5 is a circuit diagram of a delay means, which delay means finds particular utility in the preferred embodiment of FIG. 1.

Referring now to FIG. 5, wherein is shown a variable delay circuit of the type that may be used as the variable delay circuits 14 and 16 of FIG. 1. The clock signal is applied to the input of an inverting amplifier 31, which inverting amplifier may be an SN74S00 of the type manufactured by Fairchild, Inc. The output from the logic inverter circuit is directed to a passive delay circuit 32, which circuit is comprised of; an inductor 33, serially connecting the output of the inverter 31 to the input of a second inverter 34, a potentiometer 36 shunting the inductor 33, and a capacitor 35 connecting the input to the inverter 34 to a reference potential such as ground. The output of inverter 34 is the delayed output fed to either gates 18 or 20 in the embodiment shown in FIG. 1. In the preferred embodiment of the invention the inverter 34 is identical to the inverter 31. The value of inductor 33 was approximately 4.7 to 5.6 micro henries. The value of capacitor 35 was 100 picofarads and the magnitude of the resistance of the variable resistor was 500 ohms. In operation of the variable delay circuit, the potentiometer is adjusted to provide the required amount of delay between the input signal and the signal present at the output of amplifier 34. For initial calibration of the system, the system is operated with a known modulating PN sequence, the RF carrier input is directed to the double-balanced mixer and the output from the mixer is sensed while the variable delay potentiometer 36 in the variable delay circuits 14 and 16 of FIG. 1 are adjusted to provide a maximum cancellation of the carrier signal at the outut of the mixer. Once this adjustment is made, it is generally not necessary to again make the adjustment unless there has been a change in the component parts within the system and/or the frequency of the carrier signal at the input of the mixer is changed.

Figure 6:
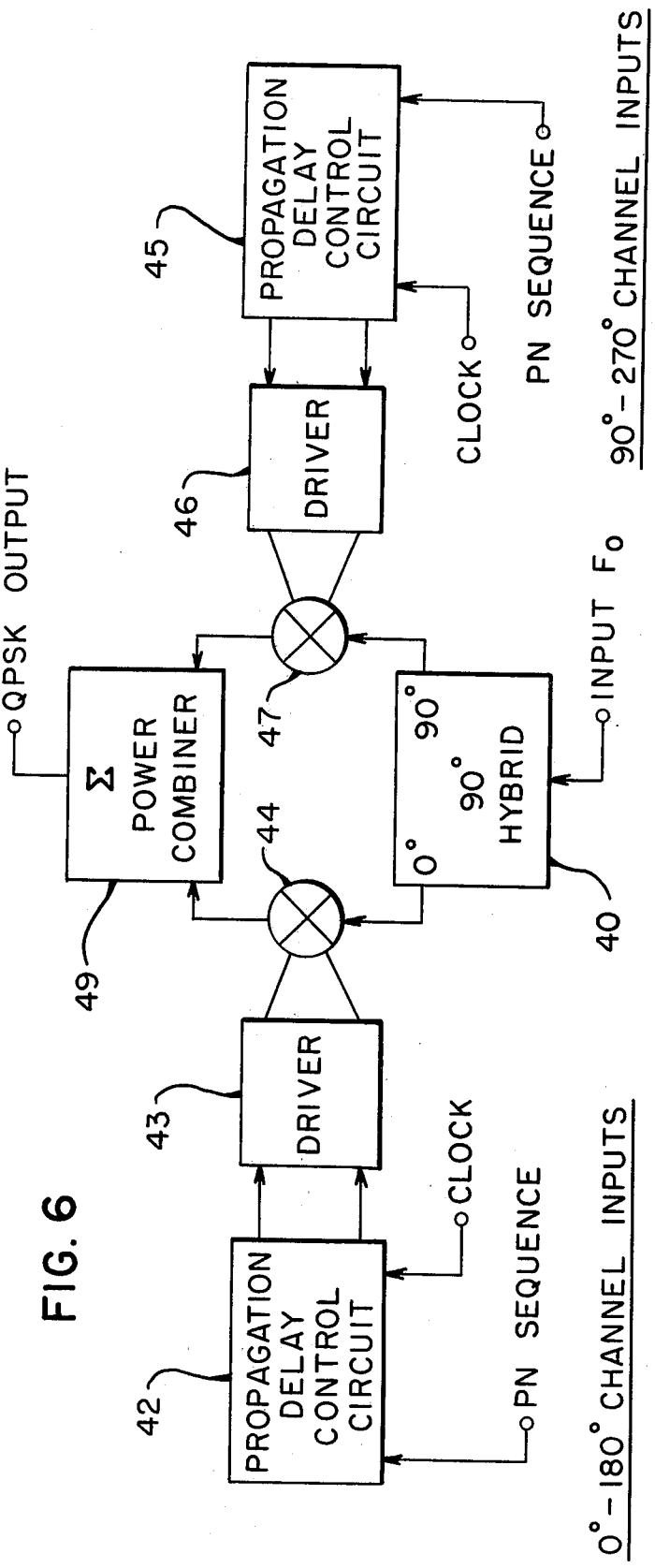
FIG. 6 is a block diagram of a second preferred embodiment of the invention.

Referring now to FIG. 6 wherein a second preferred embodiment of the invention is shown, which embodiment is directed to the processing of a quadrature phase shift keyed (QPSK) signal. A 90° hybrid circuit 40 receives at its input the carrier signal $F_0$. The hybrid circuit 40 provides two outputs, each of which are the signal $F_0$ but one is unshifted in phase (0°) while the other is shifted 90° in phase (90). The 0° shifted carrier signal $F_0$ is directed to an input of a double-balanced mixer 44, while the 90° shifted signal $F_0$ is directed to an input of the double-balanced mixer 47. Mixer 44, at its other input, receives the signal from a driver 43, which driver is activated by the propogation delay control circuit 42, which circuit is identical to the circuit 10 disclosed in FIG. 1. Circuit 42 receives as inputs the clock signal and the PN sequence signal from the PN sequence generator 11. The particular elements constituting control circuit 42, driver 43 and balanced mixer 44, comprise the 0° to 180° channel inputs for a QPSK modulating system. The 90° to 270° channel inputs are handled by the propogation delay control circuit 45, which receives as inputs the clock signal and the PN sequence signal from the PN sequence generator 11. The output from the control circuit 45 is directed to the driver circuit 46 and the driver circuit operates on this signal in a similar manner as the driver circuit 26 in FIG. 1. The output from the driver circuit is directed as the other input to the mixer 47. The output signal from mixers 44 and 47 are summed in a power combiner 49 to provide the QPSK modulated output signal.

In summary, the quality of residual local oscillator signal generally classed as the carrier signal from a mixer/modulator, depends upon the output of the mixer being the same in the two phase states over the period of the modulating PN sequence. The presence of a residual carrier signal can decrease the synchronous, continuous wave jammer protection of a spread spectrum type transmitter. The aforementioned and described circuit compensates for the amplitude imbalance of the mixers two phase states by controlling the phase dwell time for each run of ones and zeros so that the average output in the two phase states are equal over the period of the PN sequence. This is accomplished by sampling the PN sequence and reclocking the PN sequence with a delayed clock signal. After initial adjustment, the amount of delay applied is determined by whether the PN sequence at the sample time is at a 1 or a 0 level.

While there has been shown what is considered to be the preferred embodiments of the invention, it will be manifest that many changes and modifications can be made therein without departing from the essential spirit and scope of the invention. It is intended, therefore, in the annexed claims, to cover all such changes and modifications which fall within the true scope of the invention.

What is claimed is:

1. A compensating circuit for an electrical mixer comprising:
    a double-balanced mixer having first and second inputs, said first input adapted to receive an input signal;
    a modulating signal source for providing a modulating signal having at least two states;
    adjustable delay means responsive to a synchronizing component of said modulating signal for providing first and second adjustable delayed synchronizing signal components, corresponding to respective states of said modulating signal; and
    means responsive to said provided delayed signal for operatively connecting said provided modulating signal to said double-balanced mixer such that the electrical imbalance in said double-balanced mixer is minimized by adjusting said adjustable delay means.

2. The compensation circuit according to claim 1 wherein said modulating signal source provides a linear pseudo-random sequence of pulses.

3. A compensation circuit for an electrical mixer comprising:
    a mixer means having at least a first and a second input, said first input adapted to receive an input signal;
    generating means for generating a pseudo-random sequence signal having at least two states;
    a clock input adapted to receive a clocking signal;
    gating means for operatively connecting said second input of said mixer means to said generating means in response to the clocking signal received at said clock input; and
    re-clocking means operatively connected to said gating means and responsive to the states of said pseudo-random sequence signal for providing a re-clocking signal for controlling said gating means so as to adjust the amount of time said pseudo-random sequence signal is applied to said mixer means in each of said states to minimize the electrical imbalances of said mixer means.

4. The compensating circuit according to claim 3 wherein said gating means is comprised of:
    a first flip-flop means having a data input for receiving said pseudo-random sequence signal and a clocking input for receiving said clocking signal; and
    a second flip-flop means having a data input for receiving the output from said first flip-flop means and a clocking input responsive to said re-clocking signal for operatively connecting said pseudo-random sequence signal to said mixer means.

5. The compensating circuit according to claim 3 and further comprising:
    a driver means interposed between said gating means and said mixer means.

6. The compensating circuit according to claim 3 wherein said mixer means is a double-balanced mixer.

7. A compensation circuit for an electrical mixer comprising:
    a mixer means having at least a first and a second input, said first input adapted to receive an input signal;
    generating means for generating a pseudo-random sequence signal having at least two states;
    a clock input adapted to receive a clocking signal;
    gating means for operatively connecting said second input of said mixer means to said generating means in response to the clocking signal received at said clock input; and
    re-clocking means operatively connected to said gating means comprising:
        a first delay means operatively connected to said clock input for delaying the clocking signal by a first delay;
        a second delay means operatively connected to said clock input for delaying the clocking signal by a second delay, wherein the difference between said first and said second delay corresponds to a time adjustment; and
        switch means responsive to the states of said pseudo-random sequence signal for selecting the delayed signal from said first or said second delay means, so as to provide a re-clocking signal for controlling said gating means so as to adjust the amount of time said pseudo-random sequence signal is applied to said mixer means in each of said states to minimize the electrical imbalances of said mixer means.

8. A compensation circuit for an electrical mixer comprising:
    a mixer means having at least a first and a second input, said first input adapted to receive an input signal;
    generating means for generating a pseudo-random sequence signal having at least two states;
    a clock input adapted to receive a clocking signal;

gating means for operatively connecting said second input of said mixer means to said generating means in response to the clocking signal received at said clock input; and re-clocking means operatively connected to said gating means comprising:
  a first delay means operatively connected to said clock input for delaying the clocking signal by a first delay;
  a second delay means operatively connected to said clock input for delaying the clocking signal by a second delay, wherein the difference between said first and said second delay corresponds to a time adjustment; and
  switch means comprising:
    a first NAND gate for receiving as inputs the signals from said first delay means and said generating means;
    a second NAND gate for receiving as inputs the signal from said second delay means and the complement of said pseudo-random sequence signal; and
    a third NAND gate for receiving as inputs the signals from said first and said second NAND gate to provide a re-clocking signal for controlling said gating means so as to adjust the amount of time said pseudo-random sequence signal is applied to said mixer means in each of said states to minimize the electrical imbalances of said mixer means.

* * * * *